United States Patent
Miller et al.

(10) Patent No.: US 9,960,763 B2
(45) Date of Patent: May 1, 2018

(54) HIGH VOLTAGE NANOSECOND PULSER

(71) Applicant: EAGLE HARBOR TECHNOLOGIES, INC., Seattle, WA (US)

(72) Inventors: Kenneth E. Miller, Seattle, WA (US); Timothy Ziemba, Bainbridge Island, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days. days.

(21) Appl. No.: 14/542,487

(22) Filed: Nov. 14, 2014

(65) Prior Publication Data

US 2015/0130525 A1    May 14, 2015

Related U.S. Application Data

(60) Provisional application No. 61/904,278, filed on Nov. 14, 2013, provisional application No. 62/023,708, filed on Jul. 11, 2014.

(51) Int. Cl.
  *H03K 3/00* (2006.01)
  *H03K 17/56* (2006.01)
  *H03K 3/57* (2006.01)

(52) U.S. Cl.
  CPC .............. *H03K 17/56* (2013.01); *H03K 3/57* (2013.01)

(58) Field of Classification Search
  CPC ....................................................... H03K 3/36
  (Continued)

(56) References Cited

U.S. PATENT DOCUMENTS 5,313,481 A    5/1994  Cook et al.
6,359,542 B1   3/2002  Widmayer et al.
(Continued)

FOREIGN PATENT DOCUMENTS

EP    0174164 A2    3/1986
EP    1128557 A2    8/2001

OTHER PUBLICATIONS

A.Starikovskiy and N. Aleksandrov, "Plasma-assisted ignition and combustion," Progress in Energy and Combustion Science, 39, 1, Feb. 2013, pp. 61-110.
(Continued)

*Primary Examiner* — Lincoln Donovan
*Assistant Examiner* — Metasebia Retebo

(57) ABSTRACT

A nanosecond pulser may include a plurality of switch modules, a transformer, and an output. Each of the plurality of switch modules may include one or more solid state switches. The transformer may include a core, at least one primary winding wound around at least a portion of the core, each of the plurality of switch modules may be coupled with the primary windings, and a plurality of secondary windings wound at least partially around a portion of the core. The output may output electrical pulses having a peak voltage greater than about 1 kilovolt and having a pulse width of less than about 1000 nanoseconds. The output may output electrical pulses having a peak voltage greater than about 5 kilovolts, a peak power greater than about 100 kilowatts, a pulse width between 10 nanoseconds and 1000 nanoseconds, a rise time less than about 50 nanoseconds, or some combination thereof.

20 Claims, 9 Drawing Sheets

(58) Field of Classification Search
USPC .......................................................... 327/304
See application file for complete search history.

(56) References Cited

U.S. PATENT DOCUMENTS

| | | | | |
|---|---|---|---|---|
| 6,496,047 | B1* | 12/2002 | Iskander | H03K 17/102 |
| | | | | 327/109 |
| 6,831,377 | B2* | 12/2004 | Yampolsky | H01F 19/08 |
| | | | | 307/106 |
| 7,901,930 | B2* | 3/2011 | Kuthi | C12M 35/02 |
| | | | | 435/173.6 |
| 8,093,979 | B2* | 1/2012 | Wilson | H02M 7/49 |
| | | | | 336/170 |
| 8,115,343 | B2 | 2/2012 | Sanders et al. | |
| 2010/0007358 | A1 | 1/2010 | Schaerrer | |
| 2014/0109886 | A1 | 4/2014 | Singleton et al. | |
| 2014/0118414 | A1* | 5/2014 | Seo | G09G 3/3208 |
| | | | | 345/690 |

OTHER PUBLICATIONS

Gaudet, J., et al, "Research Issues in Developing Compact Pulsed Power for High Peak Power Applications on Mobile Platforms," Proc. IEEE, 92, 7, Jun. 2004, pp. 1144-1165.
D.A. Singleton et al. "Compact Pulsed-Power System for Transient Plasma Ignition," IEEE Trans. Plasma Sci., 37, 12, Aug. 2009 pp. 2275-2279.
Wang, F., "Compact High Repetition Rate Pseudospark Pulse Generator," IEEE Trans. Plasma Sci., 33, 4, Aug. 2005 pp. 1177-1181.
Singleton, D. R., "Low Energy Compact Power Modulators for Transient Plasma Ignition," IEEE Trans. Dielectr. Electr. Insul., 18, 4, Aug. 2011, pp. 1084-1090.
Rao, X., et al., "Combustion Dynamics of Plasma-Enhansed Premixed and Nonpremixed Flames," IEEE Trans. Plasma Sci., 38, 12, Nov. 2010 pp. 3265-3271.
Pokryvailo, A., et al, "A 1KW Pulsed Corona System for Pollution Control Applications." 14th IEEE International Pulsed Power Conference, Dallas, TX, USA, Jun. 15-18, 2003.
Pokryvailo, A., et al, "High-Power Pulsed Corona for Treatment of Pollutants in Heterogeneous Media," IEEE Trans. Plasma Sci., 34, 5, Oct. 2006, pp. 1731-1743.
Dammertz, G., et al, "Development of Multimegawatt Gyrotrons for Fusion Plasma Heating and Current Drive," IEEE Trans. Elec. Devices., 52, 5, Apr. 2005, pp. 808-817.
Zhu, Z., et al, "High Voltage pulser with a fast fall-time for plasma immersion ion implantation," Review Sci Inst., 82, 045102, Apr. 2011.
Sanders, J., et al, "Scalable, Compact, Nanosecond Pulse Generation with a High Repetition Rate for Biomedical Applications Requiring Intense Electric Fields," Pulsed Power Conference, 2009. PPC '09. IEEE, Washington, DC, Jun. 28, 2009-Jul. 2, 2009.
Schamiloglu, E., et al, "Scanning the Technology: Modern Pulsed Power: Charlie Martin and Beyond," Proc. IEEE, 92, 7, Jun. 2004, pp. 1014-1020.
Garwin, Richard, "Pulsed Power Peer Review Committee Report," Sandia National Laboratories Report, SAND2000-2515, Oct. 2000.
International Search Report and Written Opinion dated Oct. 6, 2015 in related PCT Application No. PCT/US2015/040204 (15 pages).
International Search Report and Written Opinion dated Feb. 20, 2015 in related PCT Application No. PCT/US2014/065832 (14 pages).
Partial Supplementary European Search Report received Aug. 2, 2017 in related foreign application No. 14861818.4 (13 pages).
U.S. Office Action in U.S. Appl. No. 14/798,154, dated Jan. 5, 2016, 12 pgs.
U.S. Office Action in U.S. Appl. No. 17/798,154, dated Oct. 6, 2016, 13 pgs.
U.S. Office Action in U.S. Appl. No. 14/798,154, dated May 26, 2017, 15 pgs.

* cited by examiner

HIGH VOLTAGE NANOSECOND PULSER

FIELD

This disclosure relates generally to a high voltage nanosecond pulser.

SUMMARY

A nanosecond pulser is disclosed that may include a plurality of switch modules, a transformer, and an output. Each of the plurality of switch modules may include one or more solid state switches. The transformer may include a core, a plurality of primary windings wound at least partially around a portion of the core, each of the plurality of switch modules may be coupled with a subset of the primary windings, and a plurality of secondary windings wound at least partially around a portion of the core.

In some embodiments, the output may output electrical pulses having a peak voltage greater than about 1 kilovolt and having a pulse width of less than about 1000 nanoseconds (or less than about 500 nanoseconds). The output may output electrical pulses having a peak voltage greater than about 5 kilovolts, a peak power greater than about 100 kilowatts, a pulse width between 10 nanoseconds and 1000 nanoseconds (e.g., less than 500 nanoseconds), a rise time less than about 50 nanoseconds, or some combination thereof.

In some embodiments, the nanosecond pulser may include one or more solid state switches selected from the group consisting of an IGBT, an FET, an SiC junction transistor, and a MOSFET.

In some embodiments, each of the plurality of switch modules comprises a snubber diode. In some embodiments, each of the plurality of switch modules comprises a fast capacitor that is not drained during each pulse cycle.

In some embodiments, the nanosecond pulser has low values of stray inductance and stray capacitance. For example, the transformer has a stray inductance of less than 100 nH. As another example, each of the plurality of switch modules has a stray inductance of less than 100 nH. In some embodiments, the stray inductance within the nanosecond pulser is less than about 100 nH. In some embodiments, the stray capacitance within the nanosecond pulser is less than about 100 pF.

In some embodiments, the transformer core may have a toroid shape. In some embodiments, the secondary winding comprises a single wire wrapped around the core multiple times. In some embodiments, the primary winding may comprise a plurality of distinct windings arranged in parallel or series.

A nanosecond pulser is disclosed that includes a circuit board, a transformer and a plurality of solid state switches. In some embodiments, the transformer can include a core that is disposed on the circuit board, a plurality of primary windings wound around at least a portion of the core, and a plurality of secondary windings wound around the core. In some embodiments, the plurality of solid state switches can be disposed radially around the transformer on the circuit board. In some embodiments, each of the plurality of solid state switches may be coupled with at least one primary winding of the transformer.

In some embodiments, the circuit board may include a plurality of slots through which at least a portion of the secondary windings are wound around the core, wherein at least a subset of the slots are disposed axially around the core. In some embodiments, the secondary windings may comprise a single wire wound around the core a plurality of times, and the primary winding comprises a plurality of distinct windings.

In some embodiments, the nanosecond pulser may include a plurality of capacitors disposed on the circuit board, wherein each of the plurality of capacitors are disposed on the circuit board between the core and at least one of the plurality of solid state switches.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed to provide nanosecond pulsing with an output pulse having high peak voltage, high peak power, short pulse widths, high pulse repetition frequency, variable peak voltage, variable peak power, variable pulse widths, variable pulse repetition frequency, or some combination thereof. For example, the peak pulse voltage can be greater than 5 kilovolts, the peak pulse power may be greater than 100 kilowatts, and the pulse width can be less than 1000 nanoseconds (e.g., less than 500 nanoseconds). Moreover, the pulse width produced by the nanosecond pulser may be variable based on an input pulse and may vary from 10 nanoseconds to 1000 nanoseconds. As another example, output pulses with high peak voltage (e.g., greater than 5 kilovolts) and/or high peak power (e.g., greater than 100 kilowatts) may be switched with rise times less than 50 nanoseconds. In some embodiments, a nanosecond pulser can include a plurality of insulated-gate bipolar transistor (IGBT) circuits (or any other solid state switches). Each of the plurality of IGBT circuits can provide nanosecond switching to primary windings of a transformer. The combination of these IGBT circuits at the transformer can produce an output pulse with high peak power and/or high peak voltage switching with fast rise times at the secondary winding of a transformer.

Figure 1:
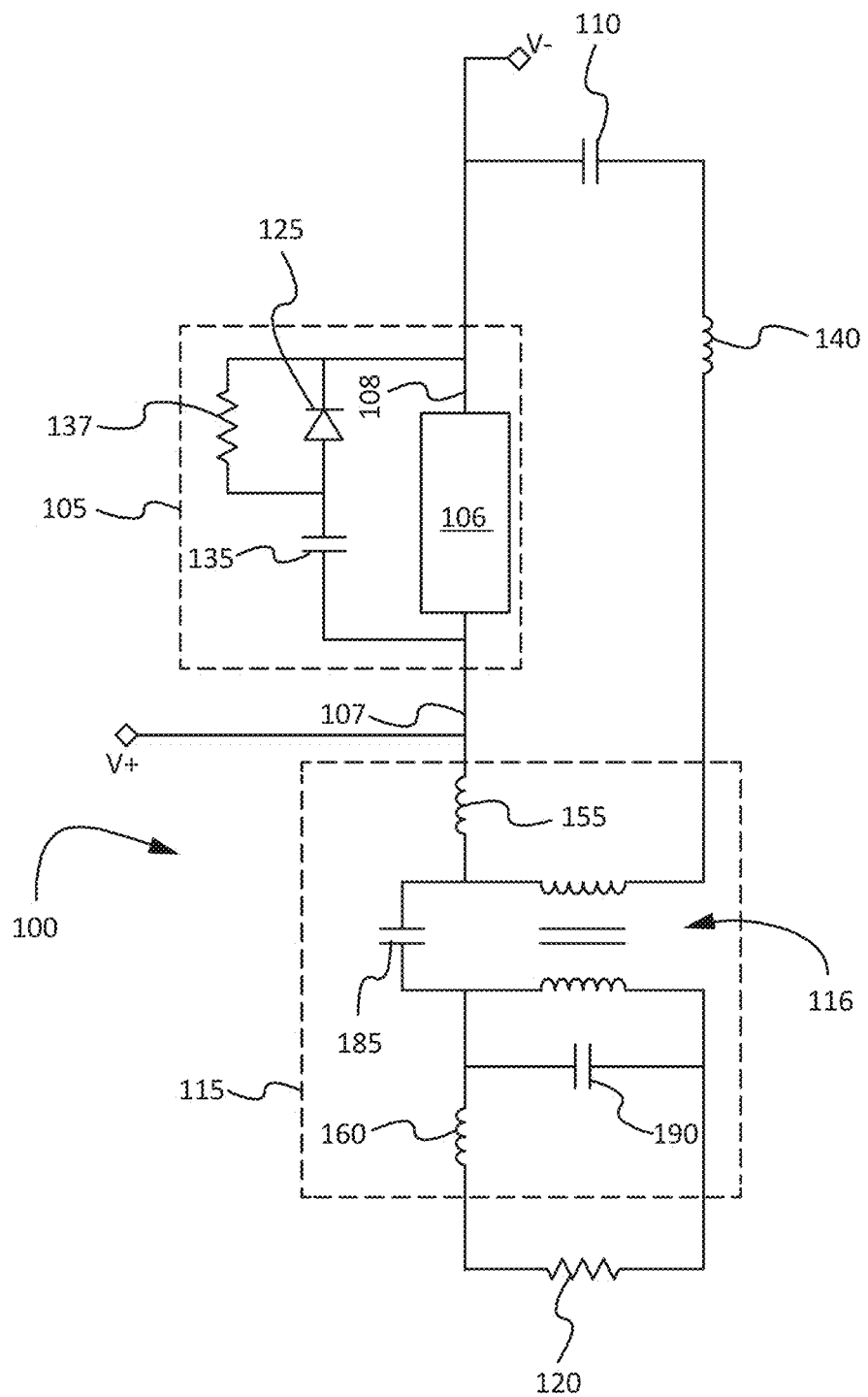
FIG. 1 illustrates an example circuit diagram of a nanosecond pulser according to some embodiments described herein.

FIG. 1 illustrates an example circuit diagram of a nanosecond pulser 100 according to some embodiments described herein. The nanosecond pulser 100 may include one or more switch modules 105 that may include a switch 106, a snubber resistor 137, a snubber capacitor 135, a snubber diode 125, or some combination thereof. In some embodiments, the snubber capacitor 135 and the snubber diode 125 may be arranged in series with each other and together in parallel with the switch 106. The snubber resistor 137, for example, may be arranged in parallel with the snubber diode 125.

The switch 106 may include any solid state switching device that can switch high voltages such as, for example, a solid state switch, an IGBT, an FET, a MOSFET, an SiC junction transistor, or a similar device. The switch 106 may include a collector 107 and an emitter 108. Various other components may be included with the switch module 105 in conjunction with the switch 106. A plurality of switch modules 105 in parallel, in series, or some combination thereof may be coupled with the transformer module 115.

The switch module 105 may be coupled with or may include a fast capacitor 110, which may be used for energy storage. In some embodiments, more than one switch module 105 may be coupled with a single fast capacitor 110. In some embodiments, the fast capacitor may be an energy storage capacitor. The fast capacitor 110 may have a capacitance value of about 1 µF, about 5 µF, between about 1 µF and about 5 µF, between about 100 nF and about 1,000 nF etc.

During switching of the switch 106, the energy in the fast capacitor 110 may be discharged to the primary winding of the transformer 116. Moreover, in some embodiments, the energy within the fast capacitor 110 may not be substantially drained during each switch cycle, which may allow for a higher pulse repetition frequency. For example, in one switch cycle 5%-50% of the energy stored within the fast capacitor 110 may be drained. As another example, in one switch cycle 10%-40% of the energy stored within the fast capacitor 110 may be drained. As yet another example, in one switch cycle 1%-5% of the energy stored within the fast capacitor 110 may be drained.

Figure 8:
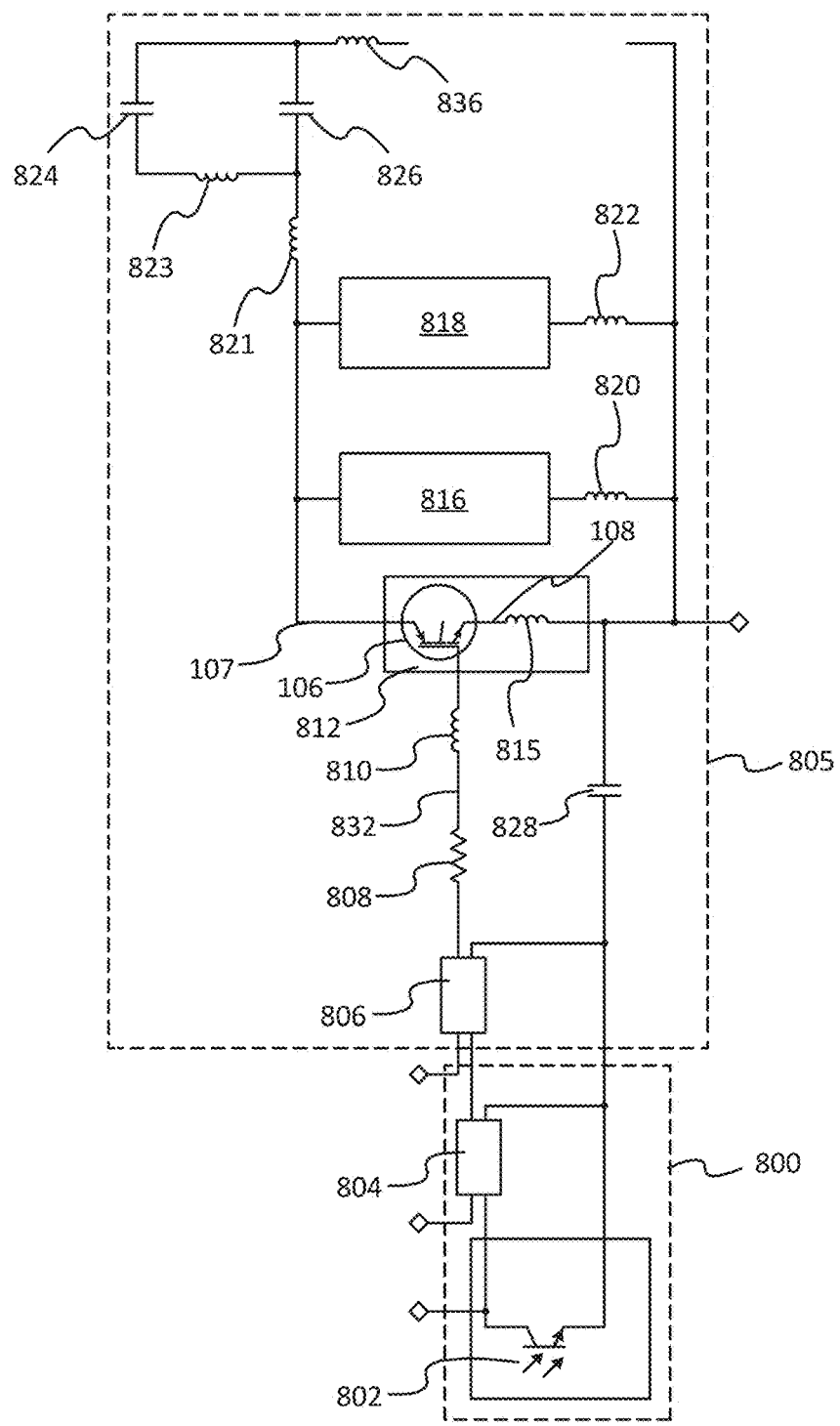
FIG. 8 is a circuit diagram of an example switch module according to some embodiments described herein.

In some embodiments, the switch module 105 may include any or all of the components shown in switch module 805 in FIG. 8.

The switch module 105 and the fast capacitor 110 may be coupled with a transformer module 115. The transformer module 115, for example, may include a transformer 116, capacitors, inductors, resistors, other devices, or some combination thereof. The transformer 116 may include a toroid shaped core with a plurality of primary windings and a plurality of secondary windings wound around the core. In some embodiments, there may be more primary windings than secondary windings. The secondary windings may be coupled with load 120 or an output that may be configured to couple with load 120.

The transformer module 115 may include stray capacitance and/or stray inductance. Stray capacitor 185 represents the transformer primary to secondary stray capacitance. Stray capacitor 190 represents the transformer secondary stray capacitance. Inductor 155 represents the primary stray inductance of the transformer, and inductor 160 represents the secondary stray inductance of the transformer.

In some embodiments, the transformer 116 may include a toroid shaped core comprised of air, iron, ferrite, soft ferrite, MnZn, NiZn, hard ferrite, powder, nickel-iron alloys, amorphous metal, glassy metal, or some combination thereof. In some embodiments one or more cores may be used.

In some embodiments, the transformer primary to secondary stray capacitance and/or the transformer secondary stray capacitance may be below about 1 pF, below about 100 pF, about 10 pF, about 20 pF, etc. In some embodiments, the sum of the secondary stray capacitance and the primary stray capacitance may be less than about 10 pF, 50 pF, 75 pF, 100 pF, 125 pF, 135 pF, etc.

In some embodiments, the secondary stray inductance of the transformer and/or the primary stray inductance of the transformer may have an inductance value, for example, of less than 1 nH, 2 nH, 5 nH, 10 nH, 20 nH, between about 1 nH and 1,000 nH, less than about 100 nH, less than about 500 nH, etc.

In some embodiments, a nanosecond pulser may be designed with low stray capacitance. For example, the sum of all stray capacitance within the nanosecond pulser may be below 500 pF. This may include transformer module stray capacitance, switch module stray capacitance, other stray capacitance, or some combination thereof.

Figure 6:
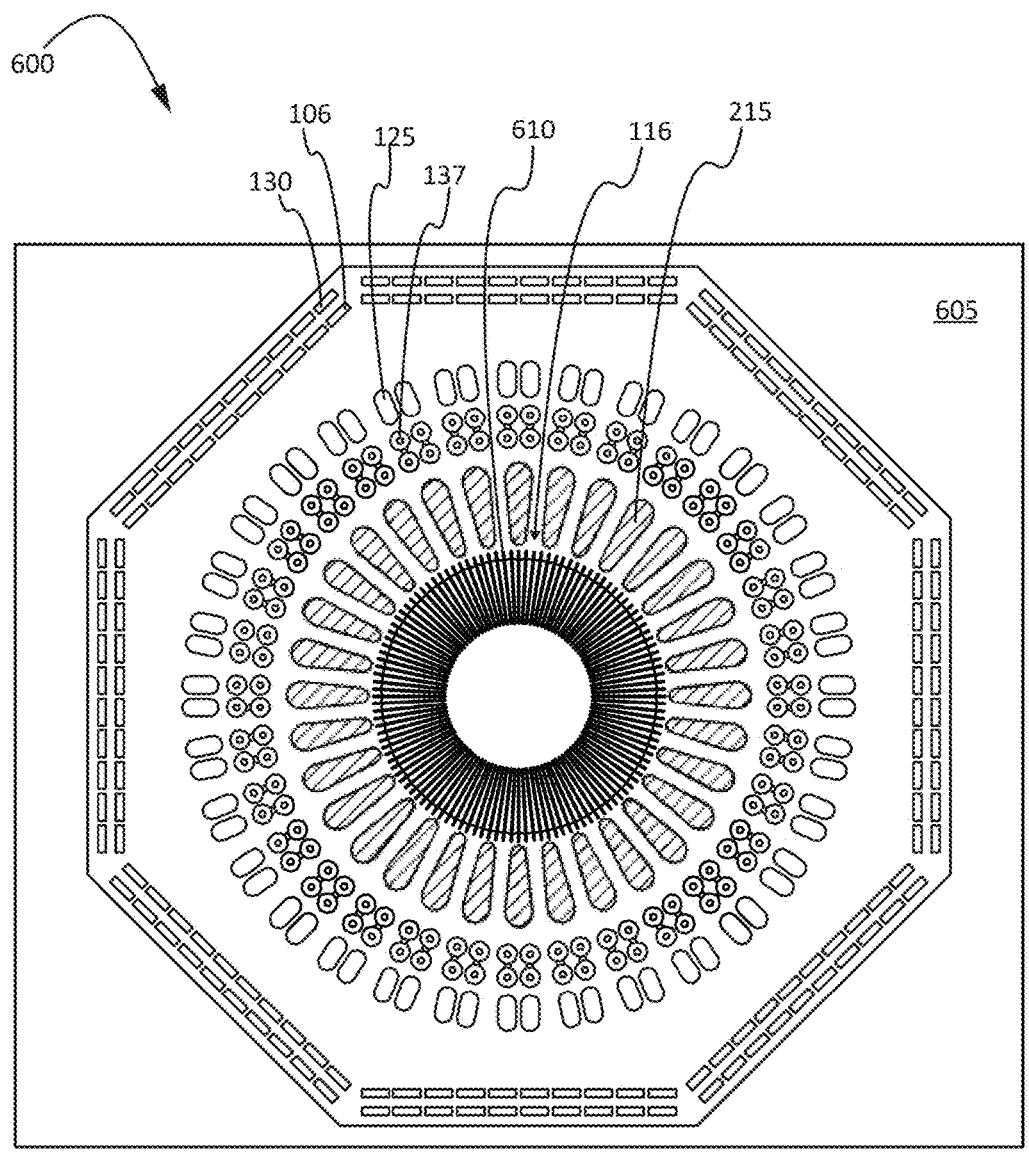
FIG. 6 illustrates an axially arranged circuit nanosecond pulser according to some embodiments described herein.

The primary windings of the transformer 116 can include a plurality of single windings (see e.g., FIG. 6). For example, each of the primary windings may include a single wire that wraps around at least a substantial portion of the toroid shaped core and terminate on either side of the core. As another example, one end of the primary windings may terminate at the collector 107 of the switch 106 and another end of the primary windings may terminate at the fast capacitor 110. Any number of primary windings in series or in parallel may be used depending on the application. For example, about 1, 2, 5, 8, 10, 20, 40, 50, 100, 116, 200, 250, 300, etc. or more windings may be used for the primary winding.

In some embodiments, a single primary winding may be coupled with a single switch module 105. In some embodiments, a plurality of switch modules may be included and each of the plurality of switch modules may be coupled with one of a plurality of primary windings. The plurality of windings may be arranged in parallel about the core of the transformer. In some embodiments, this arrangement may be used to reduce stray inductance in the nanosecond pulser 100.

The secondary winding (see e.g., FIG. 7) may include wire wrapped around the core any number of times. For example, the secondary winding may include 5, 10, 20, 30, 40, 50, 100, etc. windings. In some embodiments, the secondary winding may wrap around the core of the transformer and through portions of the circuit board. For example, the core may be positioned on the circuit board with a plurality of slots in the circuit board arranged axially around the outside of the core and an interior slot in the circuit board positioned in the center of the toroid shaped core. The secondary winding may wrap around the toroid shaped core and wrap through slots and the interior slot. The secondary winding may include high voltage wire.

Figure 2:
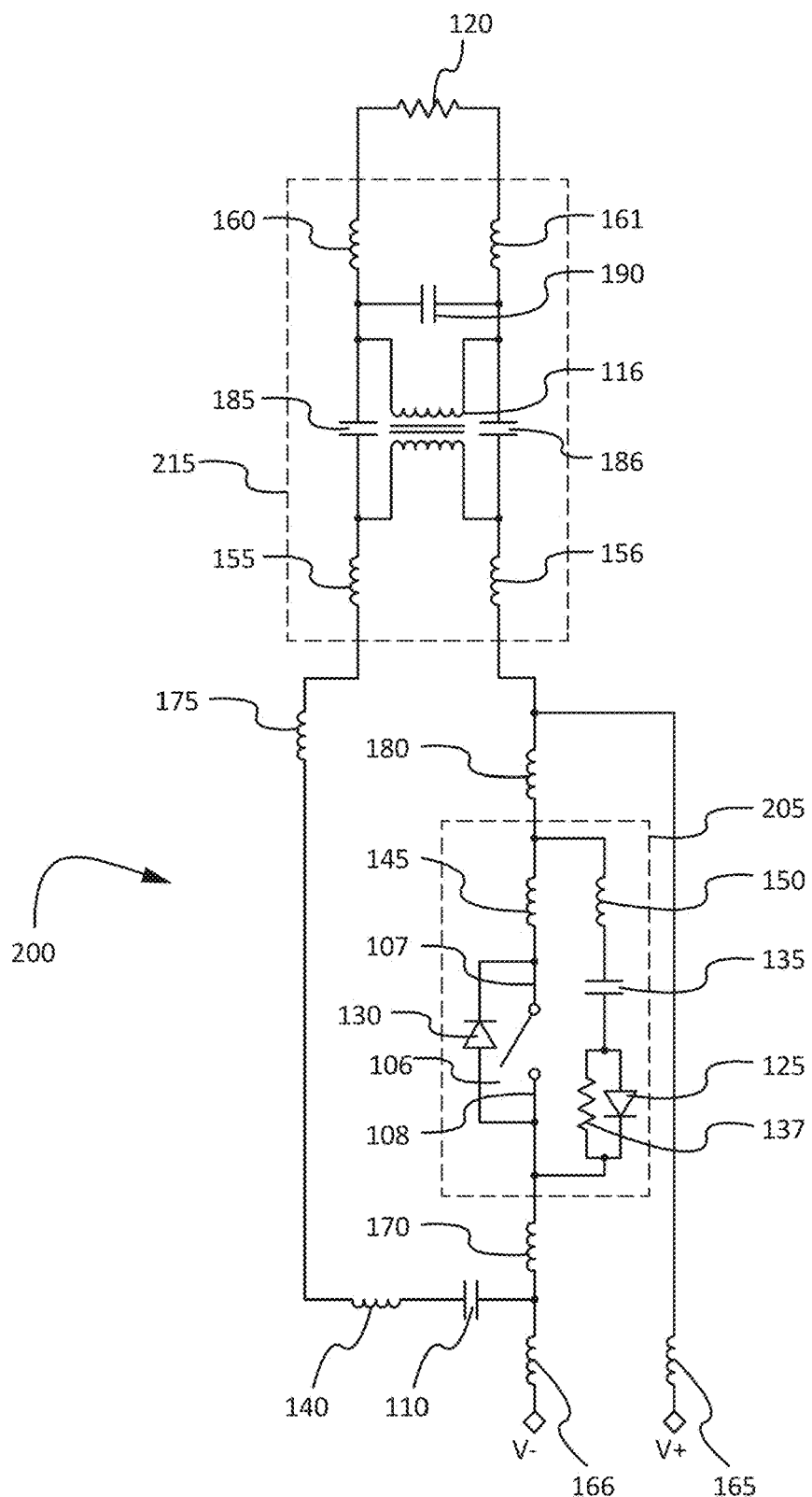
FIG. 2 illustrates an example circuit diagram of a nanosecond pulser according to some embodiments described herein.

FIG. 2 illustrates another example circuit diagram of a nanosecond pulser 200 according to some embodiments described herein. The nanosecond pulser 200 may include a switch module 205, a transformer module 215, a load 120, input, and various stray inductance and/or stray capacitance.

In some embodiments, the switch module 205 may be identical to, similar to, or include components from the switch module 105 shown in FIG. 1 and/or the switch module 805 shown in FIG. 8. In some embodiments, the transformer module 215 may be identical to, similar to, or include components from the transformer module 115 shown in FIG. 1.

In some embodiments, the switch module 205 may include a switch 106 that includes a collector 107 and an emitter 108. The switch module 205 may include a freewheeling diode 130 that is disposed in parallel with the switch 106. The switch may include some stray inductance that is represented by a switch stray inductor 145. A snubber circuit may be disposed in parallel with the switch 106 and/or the switch stray inductor 145. The snubber circuit may include snubber resistor 137 in parallel with snubber diode 125, a snubber capacitor 135, and snubber stray inductance represented by snubber stray inductor 150.

In some embodiments, the freewheeling diode 130 may be used in combination with inductive loads to ensure that energy which is stored in the inductor is allowed to dissipate after the switch 106 is opened by allowing current to keep flowing in the same direction through the inductor and energy is dissipated in the resistive elements of the circuit. If they are not used then typically this leads to a large reverse voltage on switches.

The switch module 205 may be coupled with a transformer module 215. The transformer module 215, for example, may include transformer 116, transformer capacitors, inductors, resistors, other devices, or some combination thereof. The transformer 116 may include a toroid shaped core with primary windings and secondary windings wound around the core. For example, there may be more primary windings than secondary windings. The secondary windings may be coupled with load 120 or an output that may be configured to couple with load 120.

In some embodiments, the transformer 116 may include a toroid shaped core comprised of air, iron, ferrite, soft ferrite, MnZn, NiZn, hard ferrite, powder, nickel-iron alloys, amorphous metal, glassy metal, or some combination thereof.

The primary windings of the transformer 116 can include a plurality of single windings (see e.g., FIG. 6). For example, each of the primary windings may include a single wire that wraps around at least a substantial portion of the toroid shaped core and terminate on either side of the core. As another example, one end of the primary windings may terminate at the collector 107 of the switch 106 and another end of the primary windings may terminate at the emitter 108 of the switch 106. Any number of primary windings may be used depending on the application. For example, about 10, 20, 40, 50, 100, 116, 200, 250, 300, etc. or more windings may be used for the primary winding. A single primary winding may comprise each of these single windings.

The secondary winding (see e.g., FIG. 7) may include wire wrapped around the core any number of times. For example, the secondary winding may include 5, 10, 20, 30, 40, 50, 100, etc. windings. In some embodiments, the secondary winding may wrap around the ferrite core and through portions of the circuit board. For example, the ferrite core may be positioned on the circuit board with a plurality of slots in the circuit board arranged in a circular pattern around the outside of the ferrite core and an interior slot in the circuit board positioned in the center of the toroid shaped core. The secondary winding may wrap around the toroid shaped core and wrap through slots and the interior slot. The secondary winding may include high voltage wire.

In some embodiments the core may have any of the following shapes: toroid, rectangle, square, circle, etc.

The transformer module 215 may include various stray inductance and stray capacitance. The transformer secondary stray inductance is represented by inductor 160 and/or inductor 161. The transformer primary stray inductance is represented by inductor 155 and/or inductor 156. In some embodiments, the secondary stray inductance of the transformer singularly or in combination and/or the primary stray inductance of the transformer singularly or in combination may have an inductance value, for example, of 1 nH, 2 nH, 5 nH, 10 nH, 20 nH, 50 nH, 100 nH, etc. or between about 1 nH and 100 nH. In some embodiments, the primary stray inductance of the transformer singularly or in combination with the secondary stray inductance may have an inductance value, for example, of 1 nH, 2 nH, 5 nH, 10 nH, 20 nH, 50 nH, 100 nH, etc. or between about 1 nH and 100 nH.

A stray capacitor 190 represents the stray capacitance in the secondary winding. The stray capacitance in the secondary winding may be below about 1 pF, below about 100 pF, about 10 pF, about 20 pF, etc. The primary to secondary stray capacitance is represented by stray capacitor 185 and/or stray capacitor 186. The primary to secondary stray capacitance either singularly or in combination may be below about 1 pF, below about 100 pF, about 10 pF, about 20 pF, etc.

The nanosecond pulser 200 may also include fast capacitor 110 disposed in the circuit between one terminal of the input and one input to the transformer module 215. The nanosecond pulser circuit may also include fast capacitor stray inductance represented by switch stray inductor 140. The fast capacitor stray inductance may have an inductance value, for example, of less than 1 nH, 2 nH, 5 nH, 10 nH, 20 nH, 50 nH, 100 nH, etc. or between about 1 nH and 100 nH.

The nanosecond pulser 200 may also include fast capacitor to transformer stray inductance represented by inductor 175. The fast capacitor to transformer stray inductance, for example, may have an inductance value, for example, of less than 1 nH, 2 nH, 5 nH, 10 nH, 20 nH, 50 nH, 100 nH, etc. or between about 1 nH and 100 nH.

The nanosecond pulser 200 may include stray inductance 170 between the switch module 205 and the fast capacitor 110, which, in some embodiments, may have an inductance value, for example, of less than 1 nH, 2 nH, 5 nH, 10 nH, 20 nH, 50 nH, 100 nH, etc. or between about 1 nH and 100 nH. The nanosecond pulser 200 may include stray inductance between the switch module 205 and the transformer module 215. The stray inductance 180 between the switch module 205 and the transformer module 215, for example, may have an inductance value, for example, of less than 1 nH, 2 nH, 5 nH, 10 nH, 20 nH, 50 nH, 100 nH, etc. or between about 1 nH and 100 nH.

Figure 3:
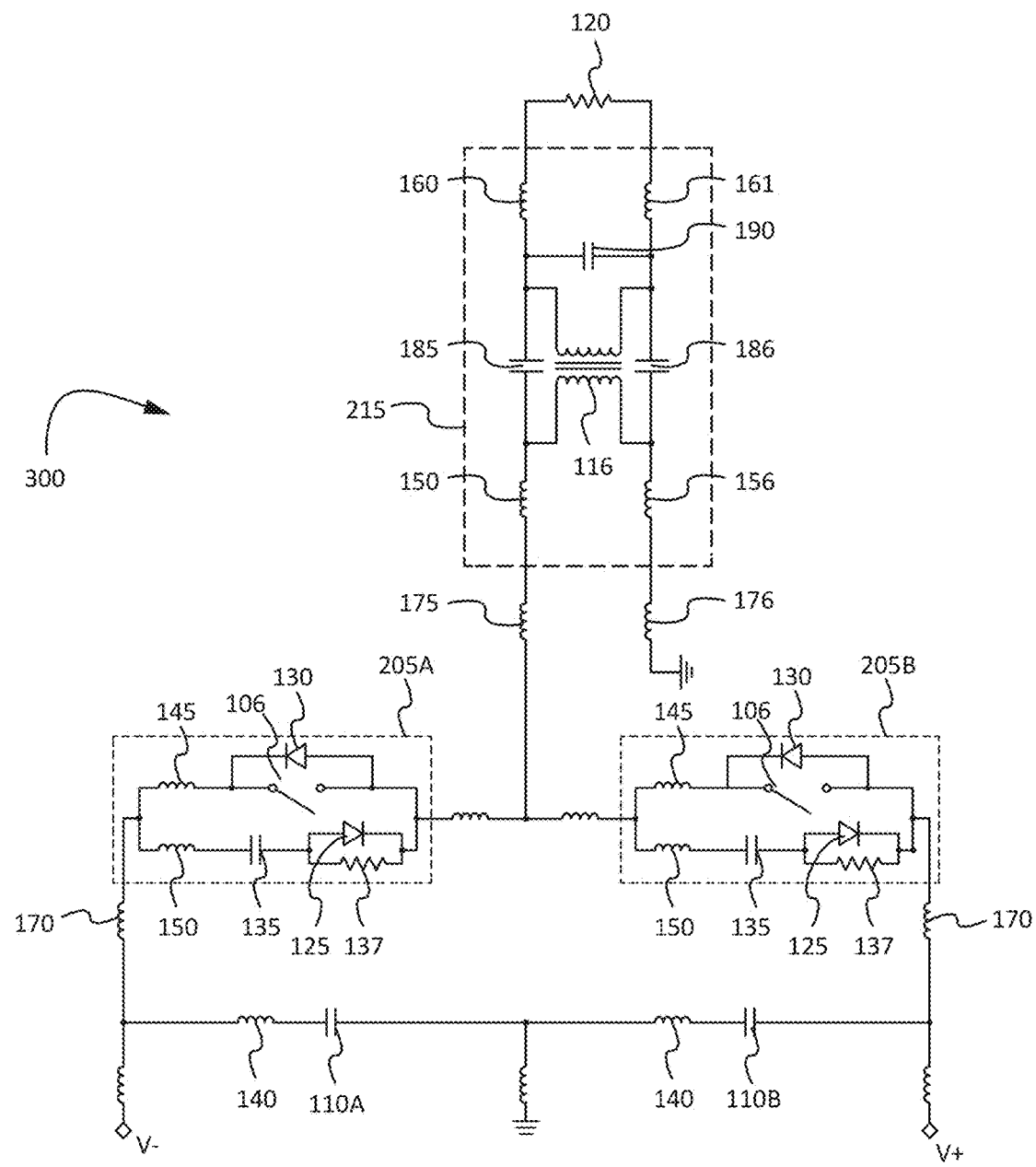
FIG. 3 illustrates an example circuit diagram of a nanosecond pulser in a half bridge configuration according to some embodiments described herein.

FIG. 3 illustrates an example circuit diagram of nanosecond pulser 300 in a half bridge configuration according to some embodiments described herein. The nanosecond pulser 300 includes two switch modules 205A and 205B coupled with the same input of the transformer module 215. Each switch module 205A and/or 205B may include the same or similar stray inductance. The switch module 205A may be associated with the fast capacitor 110A and the switch module 205B may be associated the fast capacitor 110B. Moreover, in some embodiments, each switch module 205A and/or 205B may include similar or the same components with similar or the same values. In some embodiments, the half bridge configuration may allow for both positive output pulses and negative output pulses.

The switch modules 205A and/or the switch module 205B may include singularly or in combination stray inductance that may have an inductance value, for example, of less than 1 nH, 2 nH, 5 nH, 10 nH, 20 nH, between about 1 nH and 100 nH, less than about 100 nH, less than about 500 nH, etc.

Figure 4:
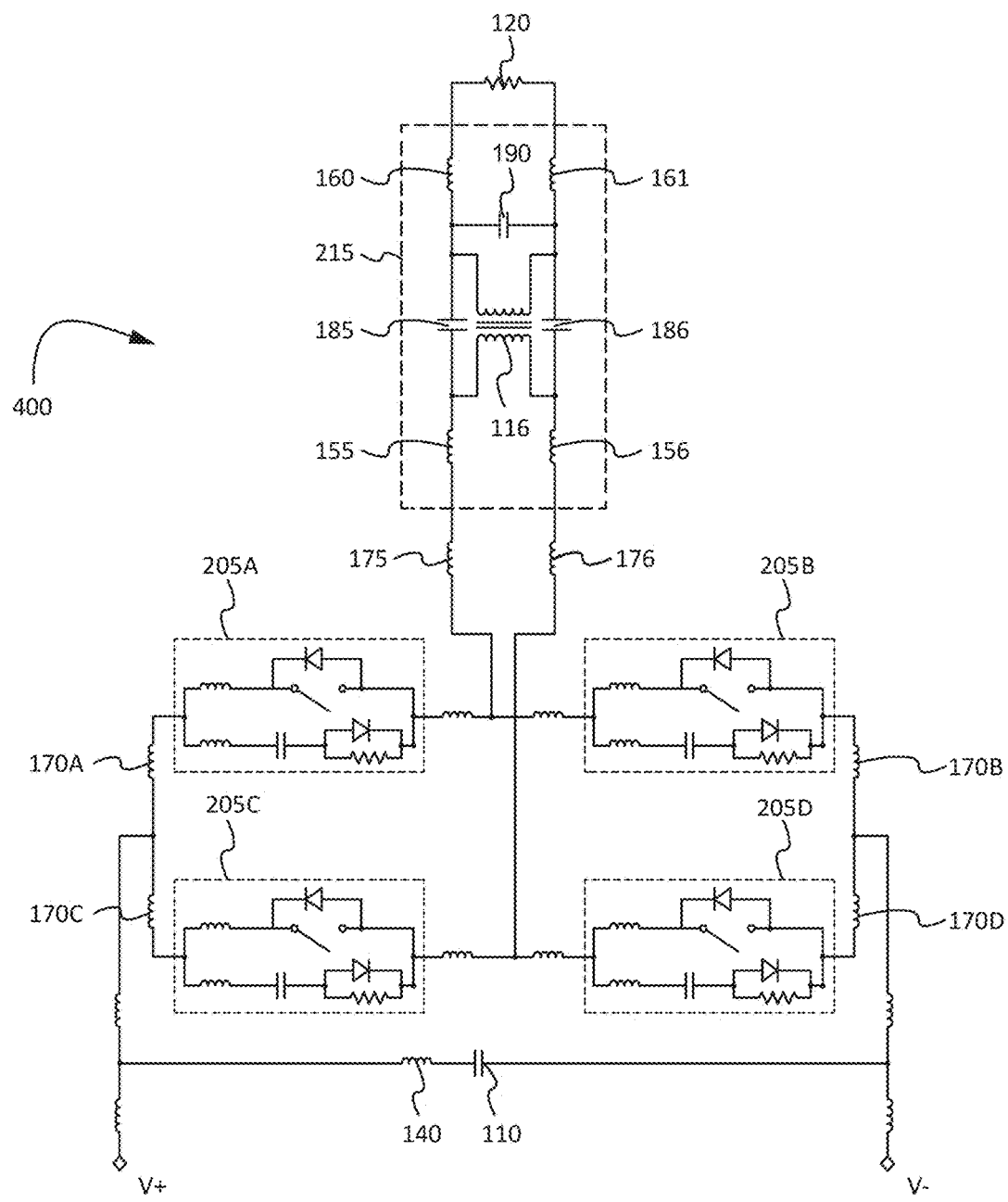
FIG. 4 illustrates an example circuit diagram of a nanosecond pulser in a full bridge configuration according to some embodiments described herein.

FIG. 4 illustrates an example circuit diagram of a nanosecond pulser 400 in a full bridge configuration according to some embodiments described herein. The nanosecond pulser 400 includes four switch modules 205A, 205B, 205C and 205D. As shown, two of the four switch modules 205A and 205C are coupled with the one input of the transformer module 215 and the other two switch modules 205B and 205D are coupled with the other input of the transformer module 215.

Stray inductance between the switch modules is represented by inductors 170A, 170B, 170C, and 170D. This stray inductance, singularly or in combination, may have an inductance value, for example, of less than 1 nH, 2 nH, 2 nH, 5 nH, 10 nH, 20 nH, 50 nH, 100 nH, etc. or between about 1 nH and 100 nH.

Figure 5:
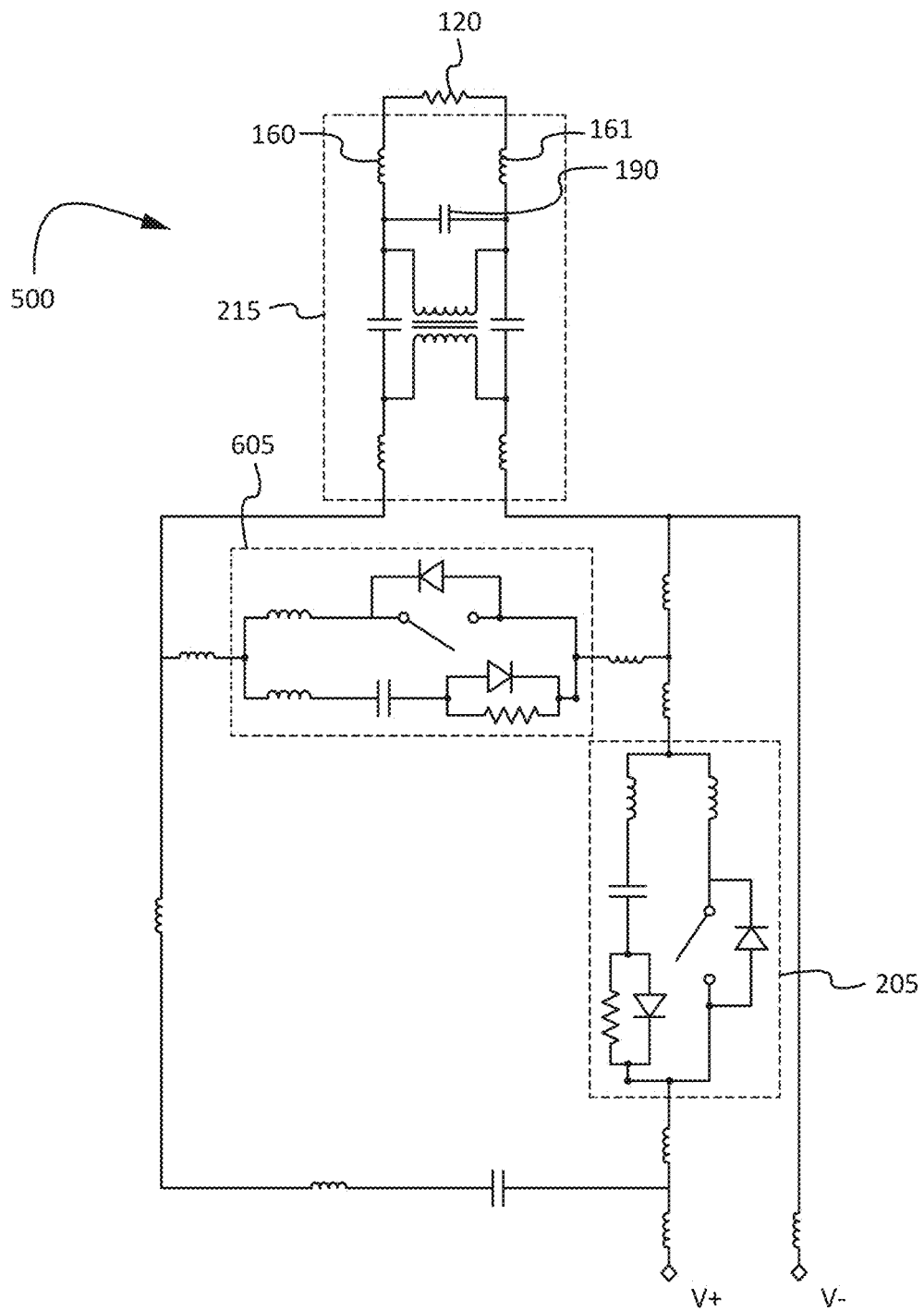
FIG. 5 illustrates an example circuit diagram of a nanosecond pulser with a tailbiter according to some embodiments described herein.

FIG. 5 illustrates an example circuit diagram of nanosecond pulser 500 with a tailbiter module 605 according to some embodiments described herein. The tailbiter module 605 may be used, for example, to absorb the residual energy from the transformer module 215 and/or associated load capacitance. The tailbiter module may also be used, for example, to terminate pulses after a predetermined period of time. In some embodiments, the tailbiter module 605 may be similar or identical to switch module 105.

In some embodiments, any of the nanosecond pulsers described herein may include a capacitor near inductor 175 and/or near inductor 176.

Figure 7:
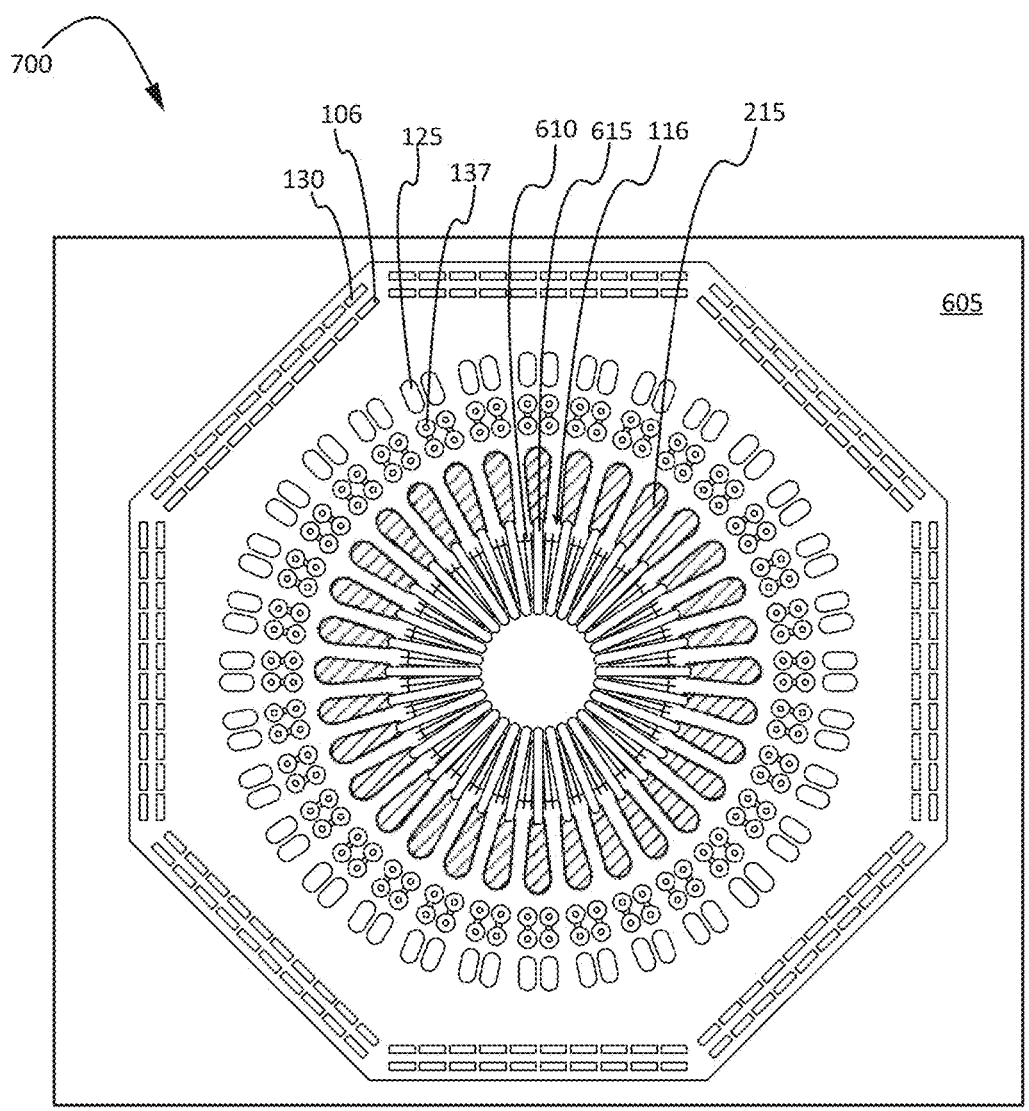
FIG. 7 illustrates an axially arranged circuit nanosecond pulser according to some embodiments described herein.

FIGS. 6 and 7 illustrate an axially arranged circuit diagram of a nanosecond pulser 600 according to some embodiments. In FIG. 6 the transformer 116 is shown with the primary winding 610 wound about the core. In FIG. 7 the transformer 116 is shown with the primary winding 610 and the secondary winding 615 wound about the core. In some embodiments, a plurality of switches 106 may be arranged symmetrically on a circuit board 605 about an axis centered at the transformer 116. The transformer 116 includes a core with a plurality of primary windings 610 and a plurality of secondary windings 615. In some embodiments, the number of secondary windings 615 may be fewer than the number of primary windings 610.

The symmetrically arranged components around the transformer can provide a number of benefits such as, for example, lowering the rise time of pulses.

In some embodiments, the snubber resistor 137 and/or the snubber diode 125 may be placed between the collector of each switch and the primary winding 610 of the transformer. The snubber diode 125 may be used to snub out any over voltages in the switching. A large and/or fast capacitor 110 may be coupled on the emitter side of each switch 106. The freewheeling diode 130 may also be coupled with the emitter side of the switch 106. Various other components may be included that are not shown in the figures.

In some embodiments, each of the plurality of the switches 106 may be arranged to switch voltage to a single primary winding 610 around the core. For example, each of a plurality of switches 106 may switch input voltage of about 10-500 volts, a voltage less than about 1200 volts, or a voltage less than about 1500 volts and current of about 20-200 amps, which, in combination with the transformer, may result in switching of peak voltages of the output pulse above 5 kilovolts and peak power of the output pulse greater than 100 kilowatts. In some embodiments, the input current may be greater or much greater than 1,000 amps.

FIGS. 6 and 7 show 64 switches 106 arranged around the core. Arranging the switches 106 and/or the other components symmetrically around the core can result in trace lengths of each switch module or circuit that may be the same or close to the same, which may minimize stray inductance in each circuit and/or in the entire circuit.

In some embodiments multiple circuit boards 605 may be stacked together and the secondary windings may wrap around the cores of two boards together to increase the peak voltage and/or the peak power of a pulse. Such an arrangement may also limit stray inductance and stray capacitance.

In some embodiments, an input voltage across V+ and V− may be applied to any of the nanosecond pulsers described herein such as, for example, nanosecond pulser 100, nanosecond pulser 200, nanosecond pulser 300, nanosecond pulser 400, and nanosecond pulser 500. The input voltage may be, for example, a voltage of about 10-500 volts, a voltage less than about 1200 volts, or a voltage less than about 1500 volts. The input voltage may be a DC voltage. An input pulse signal may be applied to the switch 106 causing the switch to open and close the switch 106 with a duration proportional with an input pulse width, an input pulse repetition frequency, or some combination thereof. The input pulse width, for example, may be between 1 ns and 1000 ns. The input pulse repetition frequency, for example, may be greater than 10 kHz or greater than 100 kHz or greater than 1 MHz. The fast capacitor 110 may be partially charged and partially discharged while the switch 106 is opened and closed. When the switch 106 is closed, energy from the fast capacitor 110 may be partially discharged through the transformer resulting in an output pulse across the load 120.

The output pulse, for example, may have a peak voltage proportional to the input voltage and/or greater than about 1 kilovolt. The output pulse, for example, may be proportional (or equivalent) to the input pulse width, or the output pulse, for example, may have a repetition frequency proportional (or equivalent) to the input pulse repetition frequency. In some embodiments, a change to one or more of the input voltage, the input pulse width, and the input pulse repetition frequency may result in a change to only a corresponding one of the output pulse peak voltage, the output pulse width, and the output repetition frequency.

In some embodiments, the sum of inductance through the switching loop of a nanosecond pulser may be less about 100 nH. For example, a switching loop may include the loop with the following components shown in FIG. 2: the fast capacitor 110, the switch stray inductor 140, the capacitor inductor 175 (the inductor 176), the inductor 155, the primary winding of the transformer 116, the inductor 156, the inductor 180, the switch 106, and inductor 170. Various other components may be included or removed from this list and still include the switching loop.

In some embodiments, the capacitor inductor 175 may have an inductance less than about 50 nH. In some embodiments, the capacitor inductor 176 may have an inductance less than about 50 nH. In some embodiments, the capacitor inductor 155 may have an inductance less than about 50 nH. In some embodiments, the capacitor inductor 156 may have an inductance less than about 50 nH. In some embodiments, the capacitor inductor 180 may have an inductance less than about 50 nH. In some embodiments, the capacitor inductor 170 may have an inductance less than about 50 nH.

In some embodiments, low inductance in some or all portions of a nanosecond pulser can provide a number of benefits. Some benefits may include, for example, low inductance may allow for high voltage pulses with high repetition frequencies. Another benefit may include, for example, low inductance may allow for high voltage pulses with short pulse widths. Another benefit may include, for example, low inductance may allow for high voltage pulses with fast rise times.

FIG. 8 is a circuit diagram of a switch module 805 according to at least one embodiment described herein. The switch module 805 includes the switch 106 along with a number of components arranged to ensure fast and/or more efficient switching. The switch module 805 shows a number of elements that can vary in location, combination, value, and/or configuration. Indeed, some elements can be replaced or removed. Others represent inherent characteristics of the circuit module and/or circuit components such as trace resistance and/or component inductance. Elements representing inherent characteristics may not be actual physical components. Instead, these elements are shown simply for discussion purposes and/or to describe that such characteristics may be present.

A receiver 802 is coupled to an external input and receives input switching signals. While the receiver 802 is coupled with a 5 volt power supply, any type of receiver operating at any voltage or power level may be used. The receiver 802 can be isolated from the environment and/or from the remaining circuitry in a number of ways. For example, the receiver 802 can be a fiber optic receiver that allows each switch module 805 to float relative to other switch modules or other circuitry. Individual module grounds can be isolated from one another, for example, using an isolation transformer. Electrical isolation of the switch module 805 can allow multiple switch modules 805 to be arranged in a series configuration for high voltage switching. Fiber optic receivers can also be used to reduce switching noise.

A pre-driver 804 and a gate driver 806 may be coupled with each switch module 805 and can provide large current pulses greater than 10 amps and continuous current greater than 2 amps to the switch 106. These drivers can be any of high speed, high current drivers designed for use with FETs, MOSFETs, IGBTs, and SiC junction transistors, or other solid state switches. For example, these drivers can be any low-side ultrafast driver manufactured by IXYS Corporation (e.g., IXYS #IXDN430 or IXYS #IXDN630).

The pre-driver 804 may be electrically coupled with the output of the receiver 802 and the output of the pre-driver 804 may be electrically coupled with the one or more gate drivers 806 resulting in a dual-driver configuration. In the configuration shown, these drivers are coupled with a 35 volt power supply, although any power supply will work. Moreover, these drivers may not be coupled with the same power supply. While fiber optic the receiver 802, the pre-driver 804 and the gate driver 806 are shown, various other receiver and driver combinations can be used such as, for example, a single receiver coupled with a single driver. In some configurations, the pre-driver 804 and the receiver 802 can be included on receiver circuit module 800 separate from switch module 805. In other configurations, these devices can be located on the same circuit module as the switch 106 and other components.

The output of the gate driver 806 is electrically coupled with the gate 832 of the switch 106. The switch 106 can include internal emitter inductance ($L_e$) 815 within effective switch 912. The resistance 808 and/or the inductance 810 show the internal resistance and/or inductance of the gate and may not be an additional component, although an additional component may be used for each. That is, the output of the gate driver 806 can be directly coupled with the gate 832 of the switch 106 using a circuit trace and/or an additional component and/or additional components. Typical switches 106 such as, for example, IGBTs, include specifications that a gate resistor is required between the gate driver 806 and the gate 832. Thus, the elimination of such a resistor is contrary to typical switch specifications.

The resistance 808 can be the effective internal resistance at the gate. This resistance can include the resistance of the trace between the gate driver 806 and the switch 106 and/or any internal resistance within the gate of the switch 106. The resistor 808 can have a resistance less than 2Ω, 1Ω, 500 mΩ, 100 mΩ, 50 mΩ, 10 mΩ, or 1 mΩ. To achieve these low resistance levels, the output of the gate driver 806 and the gate 832 of the switch 106 can have a very short physical trace length. This distance can be, for example, less than 1 cm, 500 mm, 100 mm, 50 mm, 10 mm, or 1 mm.

The inductance 810 can represent the internal inductance of the gate. This inductance can include the inductance of the trace between the gate driver 806 and the switch 106 and/or any internal inductance within the gate of the switch 106. The inductance 810 may or may not be an added component. The inductance 810 can have an inductance less than, for example, of 1 nH, 2 nH, 5 nH, 10 nH, 20 nH, 50 nH, 100 nH, etc. or between about 1 nH and 100 nH. To achieve these low inductance levels, the trace on the circuit module connecting the output of the gate driver 806 and the switch 106 can have a wide trace width. For example, this width can be greater than 1 mm, 2 mm, 3 mm, 4 mm, 5 mm, 6 mm, 7 mm, 8 mm, 9 mm, or 10 mm.

The switch 106 can include a collector 107 and an emitter 108. The emitter 108 is coupled with a 10 volt bias voltage. In other embodiments, the emitter 108 can be coupled to other bias voltages including ground.

The current bypass circuit 816 can be electrically coupled across the emitter 108 and the collector 107. This bypass may include some circuit inductance represented by the bypass inductance 820. The current bypass circuit 816 can be designed to allow for an easy current bypass to the switch 106. The capacitor 828 can be included between the emitter 108 and the gate driver 806.

A snubber 818 can also be included between the collector 107 and the emitter 108. The snubber 818 may include additional components and/or connections. Moreover, the snubber 818 may or may not include connections at the collector 107 and/or the emitter 108. The snubber 818 can include any type of snubber circuitry known in the art. For example, the snubber 818 can include a diode snubber, RF snubber, solid-state snubber, or a combination of these. For example, the snubber 818 can include a capacitor in series with a parallel configuration of a diode and a resistor. The snubber 818 can also include the snubber inductance 822 whether as part of the snubber 818 or as inductance within the snubber circuit. The snubber 818 can be used to suppress voltage transients of circuits connected with the collector 107 and the emitter 108 and/or absorb energy from stray circuit inductance to prevent over-voltage at the switch 106. The current bypass circuit 816 and the snubber 818 can be included in a single circuit.

The switch module 805 can also include the fast capacitor 826 and the slow capacitor 824 in parallel. These capacitors can have inherent inductance represented by the fast capacitor inductance 821 and slow capacitor inductance 823. In some embodiments, these inductances may result from actual inductors. In others, these inductances may be inductances within the circuit and/or capacitors 824 and 826. The fast capacitor 826 and/or the slow capacitor 824 may be located externally to the switch module 805, and/or may span multiple switch modules 805, and may not connect to each switch module 805.

The fast capacitor 826 can be in parallel with a main energy storage capacitor (e.g., the slow capacitor 824). The fast capacitor 826 may only store a small portion of the total energy required, which can allow it to be smaller, and/or be placed closer to the switch 106 than main energy storage capacitor. In so doing, stray inductance between the fast capacitor 826 and the switch 106 can be minimized. The fast capacitor 826 can absorb energy stored in the stray inductance between itself and the main energy storage capacitor, which can reduce the energy dissipated in the switch 106 during switching.

Some embodiments can allow for rapid switch gate charging. For example, the gate 832 of the switch 106 can be brought to the full manufacturer's specified Gate to Emitter Voltage (e.g., $V_{GE}$>20 volts) in a time ($t_{vg}$) less than manufacturer-specified 10% to 90% current rise time ($t_r$). Additionally some embodiments can allow for rapid switch discharging by reducing $V_{GE}$ from the manufacture's specified on state voltage to less than or equal to zero in a time less than manufacturer-specified 10% to 80% current rise time ($t_r$). These rise times can vary depending on the switch used. For some known switches this current rise time, for example, can be less than 50 ns, 40 ns, 30 ns, 20 ns, or 10 ns. Other rise times may be used. Removal of the gate resistor is one design consideration that produces fast rise times. This can allow for a sufficiently large peak current to flow to the gate to charge it more quickly than specified. The gate may have some inherent circuit or trace resistance such as, for example, on the order of less than about 2Ω. Switch manufacturers typically suggest and/or require 5Ω as the minimum gate resistance. Thus, some embodiments may use a gate resistance much less than the gate resistance recommended by the manufacturer. Some embodiments may couple a driver with the gate without a resistor in between.

Use of a gate driver (e.g., the gate driver 806) with a single discrete switch is another design consideration that can allow for fast rise times. That is, each of a plurality of switches can be coupled with a single gate driver. Typically, multiple discrete switches 106 or single switch circuit modules that include a plurality of switches are coupled with a single driver. A gate driver coupled only with a single discrete switch can generate the current needed to rapidly charge a single switch gate capacitance to the manufacturer's specified on state voltage level. (e.g., $I_g$>10 A).

Moreover, various combinations of switches and drivers can be used. For example, a single switch can be coupled with multiple drivers. As another example, multiple drivers and multiple switches can be coupled together. Any number of combinations can be used.

The reduction of the switch gate inductance (e.g. inductance 810) to very low values is another design consideration that can allow for fast rise times (e.g., $L_g$<10 nH). The gate inductance may have a high impedance from the driver output to the switch gate. The lower the value of the gate inductance the faster the gate can be charged to full voltage. Various techniques are described in this disclosure for producing low gate inductances.

Some embodiments may allow for a reduction of Collector to Emitter Current ($I_{CE}$) during the switch turn-on time. In some embodiments, the current rise time ($t_r$) through the switch at turn-on can be slower than time it takes to have the collector-to-emitter voltage ($V_{CE}$) fall ($t_f$) from 90% to 10% of its value. That is, the voltage across the switch can go from high to low before the device starts to carry any significant current. This can make the device faster and dissipate less energy during the switching process.

To accomplish current reduction during turn-on, a minimum circuit inductance can be required to effectively choke the current rise-time. This minimum circuit inductance can include any of the following singularly or in combination: the switch internal emitter inductance (Le) 815, stray inductance 836, capacitor inductance 823, and the fast capacitor inductance 821. Stray inductance 836 can include any unaccounted-for inductance in the switch module 805 and/or any inductance in circuitry coupled with the collector 107 and the emitter 108. This minimum inductance can be greater than about 50-100 nH. For example, the combination of stray inductance 836, the fast capacitor inductance 821, and switch inductance can be between 50 and 100 nH.

Some embodiments can also allow for fast shunting of current out of the switch 106 during device turn-off. This can be accomplished using, for example, current bypass circuit 816. To achieve effective current shunting, the time it takes for 50% of the current to be diverted out of the switch 106 into the current bypass circuit 816 can be less than the time it takes for the switch 106 to turn off. That is, the current bypass circuit 816 can have a current rise time ($t_r$) that is faster than the specified switch turn-off time ($t_f$). This allows for very low collector to emitter current in the switch 106 during switching, which makes the device operate faster and/or dissipates less energy during turn-off.

To ensure that current can be passed out of the switch 106, the current bypass inductance 820 can be required to be low enough to allow current to ramp up quickly in the bypass circuit as the switch begins to switch. In some embodiments, the current bypass circuit 816 can include a capacitor and/or diode in an arrangement similar to a snubber, which can allow current to flow through the current bypass circuit 816 until the capacitor is fully charged. While the current bypass circuit 816 is somewhat similar to a typical snubber, there are some differences.

Among many design considerations, snubbers can be designed to reduce and/or minimize voltage spikes across the switch that may occur during switching. Their design can be based on circuit elements that fall outside the loop formed by effective switch 812, the current bypass circuit 816 and/or the inductor 820, as well as by the properties of the circuit switch. The current bypass circuit 816 can be designed to allow current to rapidly transition from flowing through the switch to flowing through the current bypass circuit 816, largely irrespective of other circuit elements. The design of current bypass circuit 816 is largely based on circuit elements contained within the loop formed by effective switch 106, the current bypass circuit 816 and the inductor 820, as opposed to those that lie outside of this loop. In some embodiments, the current bypass inductance 820 is minimized to a value, for example, below 20 nH or 10 nH. In some embodiments, the combination of the current bypass inductance 820 and the snubber inductance 822 can be less than 20 nH. With this low inductance, current can rapidly shunt through the current bypass circuit 816. This shunting can occur in less than 100 ns, 80 ns, 60 ns, 40 ns, 20 ns, or 10 ns. In some embodiments, the current bypass circuit 816 may be combined with snubber 818.

In some embodiments, the switch 106 can be operated above the manufacture specified continuous collector current ($I_c$) level. This combined with a very low circuit inductance can allow for faster device turn-off times. In most power supply designs, operation above the manufactured specified continuous current level is avoided because high current levels can cause large voltage spikes that can damage the switch(es). Additionally, high current levels can overheat the switch(es). Moreover, it can be considered poor circuit design to operate components above/outside the manufacture's specifications.

It is well known that voltage across an inductor is equal to the inductance and the time rate of change of the current $$\left(V = L\frac{di}{dt}\right).$$

If the circuit inductance is minimized to allow for a maximum rate change of current during turn-off and a current level near, at or above the switch's specified continuous current rating is applied, voltage can be developed across internal switch emitter inductance ($L_e$) 815. This induced voltage can help the device turn-off faster. Circuit inductance can include stray inductance 836 and/or the fast capacitor inductance 821 and can have a value on the order of switch internal emitter inductance ($L_e$) 815. For example, stray inductance 836 and/or the fast capacitor inductance 821 can be less than or equal to the stray inductance 836. This effect can be seen at current levels near or above the switch's specified continuous current rating.

To avoid overheating when operating at current levels above the manufacturer's stated continuous maximum current, a plurality of switch circuit modules can be combined in series or parallel that alternate switching between switches. By alternating switching, each switch can have a cool-down period, while others switches do the work. In some embodiments, each of two subsets of switches can alternate switching. In other embodiments, each of three or more subsets of switches can alternate switching.

In some embodiments, the fast capacitor 826 can be coupled between circuitry coupled with the collector 107 and the emitter 108, and the switch 106. The inductance of this circuit is represented by the fast capacitor inductance 821, and can be very low (e.g., less than 50 nH). The fast capacitor inductance 821 can be the inherent or internal inductance of the fast capacitor 826 and/or the circuitry related to the fast capacitor 826.

A low resistance between the gate 832 and the gate driver 806 can improve the switching efficiency. This low resistance can be realized in a number of ways. In one embodiment, the gate 832 can be electrically coupled with the gate driver 806 without an external resistor being placed in series between the two components. That is, the gate driver 806 and the gate 832 can be directly coupled together through a single circuit trace. Of course, some resistance in the trace will be present, but this resistance may be minimal (e.g., less than 0.1 ohms). In another embodiment, the gate driver 806 and the switch 106 can be placed very near one another on the circuit module. For example, this distance can be less than 1 cm, 500 mm, 100 mm, 50 mm, 10 mm, 1 mm, etc. In yet another embodiment, the line trace on the circuit module between the gate driver 806 and the gate 832 can have a resistance less than 1 Ω, 500 mΩ, 100 mΩ, 50 mΩ, 10 mΩ, 1 mΩ, etc.

Switches, such as, for example, IGBTs are often operated with a collector to emitter voltage ($V_{CE}$) lower than collector to emitter voltage specified by the manufacturer to avoid over voltage spikes during switching. In a circuit with inductance, when current is changing over time the resulting voltage is a function of the inductance and the rate of the current change over time $$\left(V = L\frac{di}{dt}\right).$$

This voltage coupled with the operating voltage can produce voltage spikes above the tolerances of the switch. To mitigate these spikes, circuit designers usually slow the switching speed and/or drive the switch with a voltage below tolerance to accommodate spikes. Some embodiments include circuit modules that can switch at higher switching speeds and/or be driven with voltages at or above the manufacturer specified Collector to Emitter Voltage.

This can be accomplished in a number of ways. One example is to lower the inductance at the gate. Lower inductances can allow for faster switching without inducing or increasing voltage spikes. To do this, the trace between the gate driver 806 and the gate 832 can be shorter than standard (e.g., around 10 mm) and/or wider than standard (e.g., around 4 mm). This short and/or wide trace can lower either or both the inductance and the resistance of the gate driver 806. Various trace lengths can be used, for example, trace lengths less than 20 mm, 15 mm, 5 mm, 2 mm, or 1 mm can be used. Various trace widths can be used, for example, trace widths greater than 1 mm, 2 mm, 3 mm, 4 mm, 5 mm, 6 mm, 7 mm, 8 mm, 9 mm, 10 mm can be used.

Various other inductance lowering techniques can be used. By employing these techniques the inductance at the gate can be less than, for example, of 1 nH, 2 nH, 5 nH, 10 nH, 20 nH, 50 nH, 100 nH, etc. or between about 1 nH and 100 nH. For example, multiple traces can be run in various board layers, and/or on the underside of the board.

In another embodiment, the inductance of the entire circuit module without the switch can be less than inductance of the switch (e.g., the inductance 815). In yet another embodiment, the inductance of the gate circuit is less than inductance of the switch.

In some embodiments, a plurality of switch modules 805 can be coupled together in series to provide higher voltage and/or parallel to provide higher current. For example, if each switch module 805 can switch 1 kV, then 20 switch modules can be coupled in series to switch 20 kV. Various other configurations can also be used. A similar strategy can be employed for increasing the current with a parallel configuration.

Switch modules according to some embodiments can have turn-on delay times ($t_{d(on)}$) and/or turn-off delay times ($t_{d(off)}$) that are shorter than manufacture specified times. For example, a switch module 805 can have a turn-on delay time ($t_{d(on)}$) and/or a turn-off delay time ($t_{d(off)}$) that is less than half the manufacturer's specified time by the switch manufacturer. As another example, a switch module can have a turn-on delay time ($t_{d(on)}$) and/or a turn-off delay time ($t_{d(off)}$) that is less than one-fourth the manufacturer's specified time.

Figure 9:
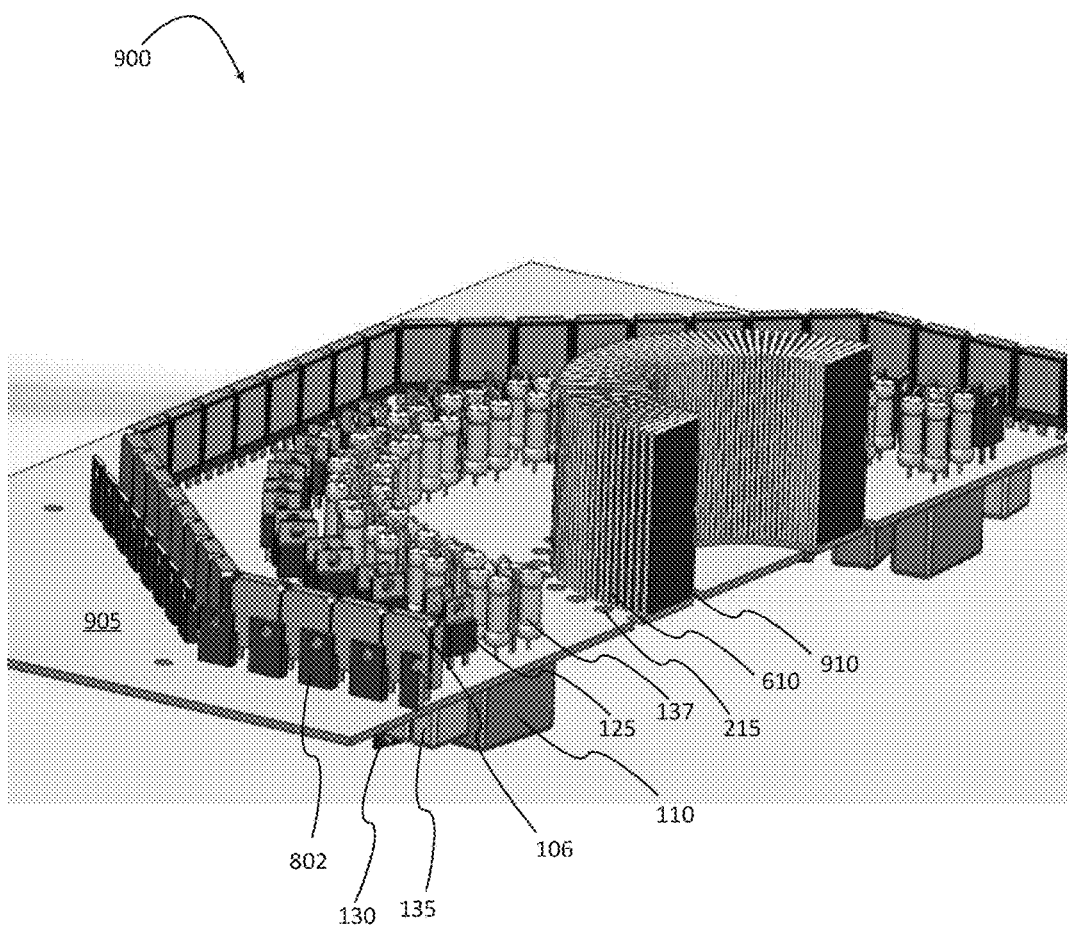
FIG. 9 illustrates an axially arranged nanosecond pulser according to some embodiments described herein.

FIG. 9 illustrates an axially arranged nanosecond pulser 900 according to some embodiments described herein. The figure shows the transformer 116 is shown with the primary winding 610 wound about the core 910. A plurality of switches 106 may be arranged symmetrically on the circuit board 905 about an axis centered at the transformer 116. The transformer 116 includes the core 910 with a plurality of primary windings 610 and a plurality of secondary windings (not shown). In some embodiments, the number of secondary windings may be fewer than the number of primary windings 610.

In some embodiments, the snubber resistor 137 and/or the snubber diode 125 may be placed between the collector of each switch and the primary winding 610 of the transformer. The snubber diode 125 may be used to snub out any over voltages in the switching. A large and/or fast capacitor 110 may be coupled on the emitter side of each switch 106. The freewheeling diode 130 may also be coupled with the emitter side of the switch 106. The fast capacitor 110 and the freewheeling diode are disposed on the bottom of the circuit board 905. Various other components may be included that are not shown in the figures.

In some embodiments, a nanosecond pulser may output electrical pulses having a peak voltage greater than about 1 kilovolt, having a pulse width of less than about 1000 nanoseconds (e.g., less than 500 nanoseconds), having a peak voltage greater than about 5 kilovolts (e.g., from 0 kV to 100 kV), having a peak power (e.g., the product of the peak current and the peak voltage at either the peak current or the peak voltage) greater than about 100 kilowatts, having a pulse width between 1 ns and 1000 ns (or 10 ns and 500 ns), having a pulse repetition frequency from single pulse to greater than 10 kHz or greater than 100 kHz or greater than 1 MHz, having a rise time of less than 50 nanoseconds, having a current rate of change (dI/dt) on the primary transformer greater than 10-1000 amps/µs and/or having a voltage rate of change (dV/dt) on the primary transformer of greater than 10-1000 V/µs, some combination thereof.

The term "about," unless otherwise specified or otherwise known in the relevant art, mean plus or minus five percent of the value being referred to.

In some embodiments, the inductance of the switch module 105, the switch module 205 and/or the switch module 805 may be lower than 100 nH. Such low inductance, for example, may contribute to fast rise times.

Various embodiments describe the arrangement of components relative to a switch emitter and a switch collector, these components can be rearranged so that components described being coupled with an emitter of the switch may be coupled with the collector of the switch and those components described being coupled with a collector of the switch may be coupled with the emitter of the switch.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A nanosecond pulser comprising:
   a plurality of switch modules, each of the plurality of switch modules include one or more solid state switches, wherein a duration of opening and closing of the solid state switches is directly proportional to a pulse width of an input pulse;
   a transformer electrically coupled with the plurality of switches comprising:
      at least one core;
      a primary winding that includes a plurality of single windings that are each wound at least partially around a portion of the at least one core, each of the plurality of switch modules are electrically coupled with one of the plurality of single windings; and
      a plurality of secondary windings wound at least partially around a portion of the core; and
   an output coupled with the plurality of secondary windings, the output providing an output pulse having a peak voltage greater than about 1 kilovolt and having a pulse width of less than about 1000 nanoseconds, and wherein a pulse width of the output pulse has a duration that is proportional to a duration of a pulse width of the input pulse.

2. The nanosecond pulser according to claim 1, wherein the primary winding comprises a plurality of primary windings wound at least partially around a portion of the core, and wherein each of the plurality of switch modules are coupled with a subset of the primary windings.

3. The nanosecond pulser according to claim 1, wherein the output pulse has a peak voltage greater than about 5 kilovolts.

4. The nanosecond pulser according to claim 1, wherein the output pulse has a peak power greater than about 100 kilowatts.

5. The nanosecond pulser according to claim 1, wherein the output pulse has a rise time less than about 50 nanoseconds.

6. The nanosecond pulser according to claim 1, wherein each of the one or more solid state switches comprises a switch selected from the group consisting of an IGBT, an FET, an SiC junction transistor, and a MOSFET.

7. The nanosecond pulser according to claim 1, further comprising a fast capacitor electrically coupled with the primary winding and at least one of the plurality of switch modules.

8. The nanosecond pulser according to claim 7, wherein less than 50% of the energy in the fast capacitor is drained during each electrical pulse.

9. The nanosecond pulser according to claim 7, wherein the fast capacitor has a stray inductance of less than 100 nH.

10. The nanosecond pulser according to claim 1, wherein the transformer has a stray inductance of less than 100 nH.

11. The nanosecond pulser according to claim 1, wherein each of the plurality of switch modules has a stray inductance of less than 100 nH.

12. The nanosecond pulser according to claim 1, wherein stray inductance within the switch module and the primary winding is less than 100 nH.

13. The nanosecond pulser according to claim 1, wherein stray capacitance within the nanosecond pulser is less than about 100 pF.

14. A nanosecond pulser comprising:
a circuit board;
a transformer having a transformer core disposed on the circuit board, a plurality of primary windings, such that each of the primary windings include a plurality of single windings that are each wound around at least a portion of the core, and a plurality of secondary windings wound around the core; and
a plurality of solid state switches disposed radially around the transformer on the circuit board, each of the plurality of solid state switches are coupled with at least one of the plurality of single windings of the transformer, wherein a duration of opening and closing of the plurality of solid state switches is directly proportional to a pulse width of an input pulse, and wherein an output pulse width from an output coupled with the plurality of secondary windings is directly proportional to the pulse width of the input pulse.

15. The nanosecond pulser according to claim 14, wherein the circuit board includes a plurality of slots through which at least a portion of the secondary windings are wound around the core, wherein at least a subset of the slots are disposed symmetrically around the core.

16. The nanosecond pulser according to claim 14, further comprising a plurality of capacitors disposed on the circuit board, wherein each of the plurality of capacitors are disposed on the circuit board between the core and at least one of the plurality of solid state switches.

17. The nanosecond pulser according to claim 14, further comprising a plurality of diodes disposed on the circuit board, wherein each of the plurality of diodes are disposed on the circuit board between the core and at least one of the plurality of solid state switches.

18. The nanosecond pulser according to claim 14, wherein the secondary windings comprises a single wire wound around the core a plurality of times, and the primary winding comprises a plurality of distinct windings.

19. A nanosecond pulser comprising:
a plurality of solid state switches;
an input electronically coupled with the plurality of solid state switches, wherein the input provides an input pulse signal to the plurality of solid state switches having an input pulse width between 1 ns and 1000 ns and an input pulse repetition frequency greater than 10 kHz, wherein a duration of opening and closing of the plurality of solid state switches is directly proportional to the input pulse width of the input pulse signal;
a transformer having a primary side and a secondary side, the primary side is electronically coupled with the plurality of solid state switches; and
an output electrically coupled with the second side of the transformer, the output configured to produce an output voltage comprising:
an output pulse peak voltage proportional to the input voltage and greater than about 1 kilovolt,
a pulse width of the output pulse that is directly proportional to a pulse width of the input pulse, and
a pulse repetition frequency of the output pulse that is proportional to a pulse repetition frequency of the input pulse;
wherein, in the event of a change to one of the input voltage, the input pulse width, and the input pulse repetition frequency there is a change to only a corresponding one of the output pulse peak voltage, the output pulse width, and the output repetition frequency.

20. The nanosecond pulser according to claim 19, further comprising a transformer having a core, a plurality of primary windings, and a plurality of secondary windings, wherein the plurality of solid state switches are electrically coupled with the primary windings and the and the output is electrically coupled with the secondary windings.

* * * * *